United States Patent
Gektin et al.

(10) Patent No.: US 6,727,193 B2
(45) Date of Patent: Apr. 27, 2004

(54) APPARATUS AND METHODS FOR ENHANCING THERMAL PERFORMANCE OF INTEGRATED CIRCUIT PACKAGES

(75) Inventors: Vadim Gektin, San Jose, CA (US); Deviprasad Malladi, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/093,669

(22) Filed: Mar. 8, 2002

(65) Prior Publication Data

US 2003/0171006 A1 Sep. 11, 2003

(51) Int. Cl.⁷ .............................. H01L 21/26
(52) U.S. Cl. .................................. 438/795
(58) Field of Search .................. 438/795; 257/778

(56) References Cited

U.S. PATENT DOCUMENTS

| | | |
|---|---|---|
| 4,680,618 A | 7/1987 | Kuroda et al. |
| 4,914,551 A | 4/1990 | Anschel et al. |
| 5,130,771 A | 7/1992 | Burnham et al. |
| 5,247,426 A | 9/1993 | Hamburgen et al. |
| 5,305,186 A * | 4/1994 | Appelt et al. ............ 361/704 |
| 5,675,474 A | 10/1997 | Nagase et al. |
| 6,014,317 A | 1/2000 | Sylvester |
| 6,097,602 A | 8/2000 | Witchger |
| 6,114,048 A | 9/2000 | Jech et al. |
| 6,264,882 B1 | 7/2001 | Colella et al. |
| 6,281,573 B1 * | 8/2001 | Atwood et al. ............ 257/706 |
| 6,288,900 B1 | 9/2001 | Johnson et al. |
| 6,292,369 B1 | 9/2001 | Daves et al. |
| 6,392,890 B1 | 5/2002 | Katchmar |

OTHER PUBLICATIONS

Elizabeth Corcoran, Technology, "To Hot To Handle", Forbes, Apr. 2, 2001. 3 pages.

* cited by examiner

*Primary Examiner*—David Nelms
*Assistant Examiner*—Thao P. Le
(74) *Attorney, Agent, or Firm*—Blakely Sokoloff Taylor & Zafman, LLP

(57) ABSTRACT

Novel methods and apparatus to enhance thermal performance of IC packages are disclosed. In an embodiment, a method of enhancing thermal uniformity across a semiconductor device is disclosed. The method includes providing the semiconductor device. The semiconductor device has a plurality of thermal regions. A first thermal region of the plurality of thermal regions has a different temperature than a second thermal region of the plurality of thermal regions. The method further provides a thermal enhancement material substantially adjacent to the first and second thermal regions. In another embodiment, a thermal conductivity of the thermal enhancement material is adjusted in relation to a temperature effecting the thermal enhancement material.

16 Claims, 3 Drawing Sheets

APPARATUS AND METHODS FOR ENHANCING THERMAL PERFORMANCE OF INTEGRATED CIRCUIT PACKAGES

FIELD OF INVENTION

The present invention generally relates to the field of electronic device manufacturing. More specifically, the present invention relates to techniques for enhancing thermal performance of integrated circuit (IC) packages.

BACKGROUND OF INVENTION

As integrated circuit fabrication technology improves, manufacturers are able to integrate additional functionality onto a single silicon substrate. As the number of these functionalities increases, however, so does the number of components on a single chip. Additional components add additional signal switching, in turn, creating more heat. Also, the complexity of these devices poses a further thermal problem where different regions on a same die may have operationally significant differences in temperature.

Thermal expansion differences have been a fundamental problem facing the semiconductor industry. The different temperature regions on the same die intensify the thermal expansion problems. During normal operation, a semiconductor device is expected to survive a fairly wide range of temperature fluctuations. While undergoing these fluctuations, if a portion of the device expands and contracts at one rate while another portion of the same device moves at vastly different rates, a great deal of stress can be generated within the combined structure. These stresses can produce failures within the components themselves or at any of the interfaces between these components.

Accordingly, performance and reliability of an IC package depends, among other things, on temperature uniformity across the circuits on a die. Temperature differences between portions of the die circuit may lead to timing problems and clock speed reductions (thereby slowing the speed of a chip). This in turn can degrade performance of the chip. In some cases, such problems may lead to soft errors where a chip may provide a wrong result without totally failing or producing any error messages.

An additional problem stems from the fact that different regions of a same die may change their thermal behavior over time. In other words, a region that may be hot at a first point in time may be considered cold at a later point, whereas an adjacent region that may have been cold at the first point in time may be hot at the later point.

A current approach in electronic cooling is to provide the best thermal path for the heat being generated within the circuitry of the IC package. As a result, areas of the die that either produce less power, or are inactive at a given time, stay significantly cooler than the areas with the maximum power generation. This causes an elevated temperature difference across the die, thereby exasperating the thermal non-uniformity issues. Removing additional heat from the "hot" spots is impractical because the heat path used is often near its best price/performance considerations already.

SUMMARY OF INVENTION

The present invention includes novel methods and apparatus to enhance thermal performance of IC packages. In an embodiment, a method of enhancing thermal uniformity across a semiconductor device is disclosed. The method includes providing the semiconductor device. The semiconductor device has a plurality of thermal regions. A first thermal region of the plurality of thermal regions has a different temperature than a second thermal region of the plurality of thermal regions. The method further provides a thermal enhancement material substantially adjacent to the first and second thermal regions.

In another embodiment, a thermal conductivity of the thermal enhancement material is adjusted in relation to a temperature effecting the thermal enhancement material.

In a yet a different embodiment, the thermal conductivity of the thermal enhancement material increases as the temperature effecting the thermal enhancement material increases.

In a further embodiment, the thermal conductivity of the thermal enhancement material decreases as the temperature effecting the thermal enhancement material decreases.

In a different embodiment, an apparatus for enhancing thermal uniformity across a semiconductor device is disclosed. The apparatus includes the semiconductor device. The semiconductor device has a plurality of thermal regions. A first thermal region of the plurality of thermal regions has a different temperature than a second thermal region of the plurality of thermal regions. A thermal enhancement material is located substantially adjacent to the first and second thermal regions.

In an additional embodiment, the semiconductor device is a device selected from a group comprising a die, an IC, a processor, and an ASIC.

In yet a further embodiment, the thermal enhancement material is in close proximity to at least one of the first and second thermal regions.

In yet a different embodiment, the thermal enhancement material is located within a thermal path of the semiconductor device.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1A:
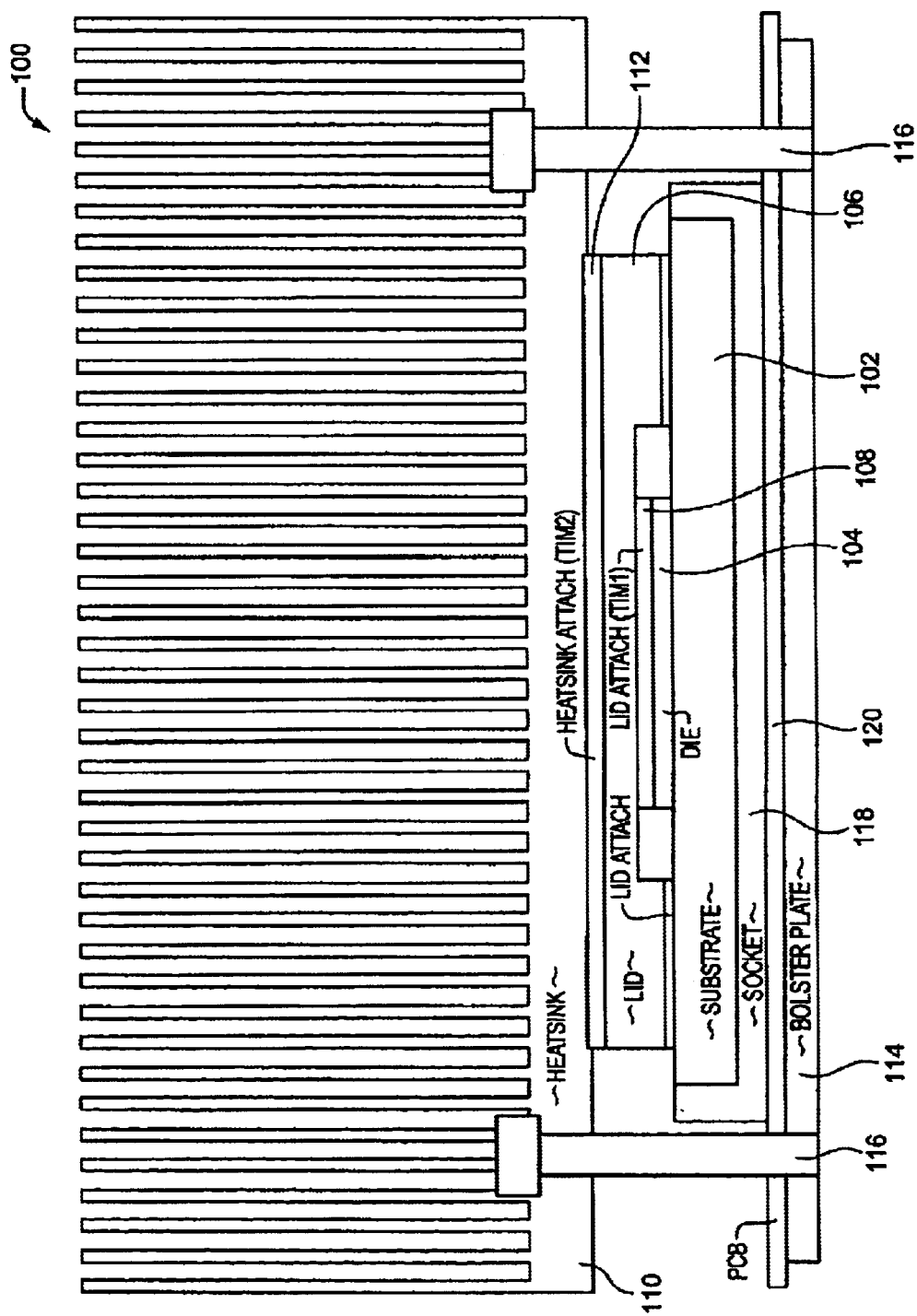
FIG. 1A illustrates an exemplary partial cross-sectional view of a device 100 in accordance with an embodiment of the present invention.

FIG. 1A illustrates an exemplary partial cross-sectional view of a device 100 in accordance with an embodiment of the present invention. A substrate 102 is attached to a die 104. A lid 106 is attached to the die 104 via a lid attach 108 (where TIM1 stands for thermal interface material 1). The lid 106 is attached to a heat sink 110 via a heat sink attach 112 (where TIM2 stands for thermal interface material 2). The heat sink 110 is envisioned to be constructed using material including copper and/or aluminum with or without vapor chambers or heat pipes, for example, inside of the base, and the like. The heat sink 110 may dissipate heat generated by circuitry present on, for example, the die 104. The heat sink 110 is attached to a bolster plate 114 via connector(s) 116. The bolster plate 114 is envisioned to provide structural support for the device 100. The bolster plate 114 may be attached to a socket 118 via a printed circuit board (PCB) 120. The socket 118 may be attached to the PCB 120 via solder balls (not shown). In an embodiment, it is envisioned that socket 118 may hold a package (e.g., including the substrate, die, lid attach, and/or lid). The device 100 may be utilized as a lidded design for any semiconductor device including an integrated circuit, a processor, an application specific integrated chip (ASIC) and the like.

Figure 1B:
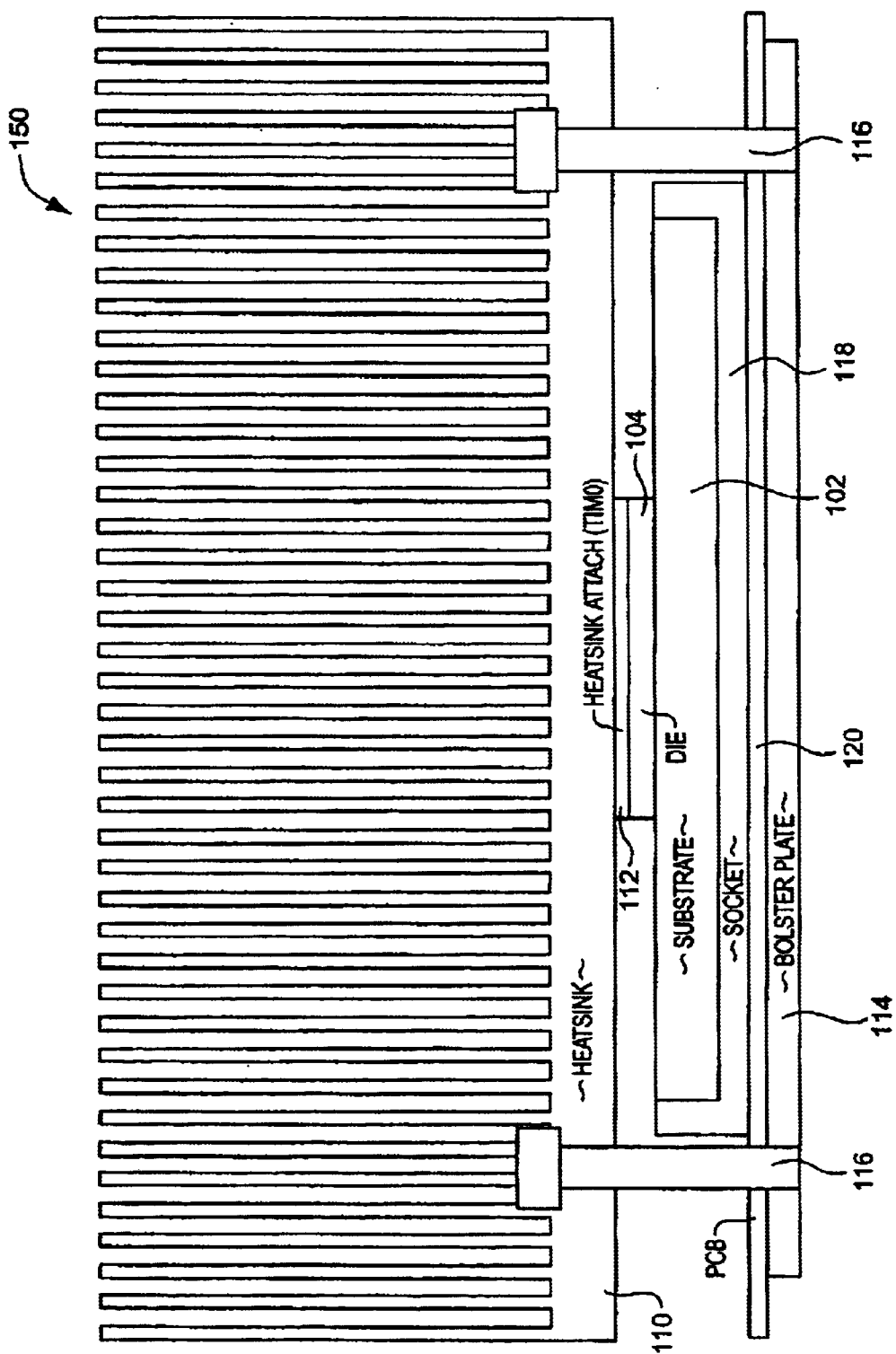
FIG. 1B illustrates an exemplary partial cross-sectional view of a device 150 in accordance with an embodiment of the present invention.

FIG. 1B illustrates an exemplary partial cross-sectional view of a device 150 in accordance with an embodiment of the present invention. A substrate 102 is attached to a die 104. A heat sink 110 is attached to the die 104 via a heat sink attach 112 (where TIM0 stands for thermal interface material 0). The heat sink 110 may dissipate heat generated by circuitry present on, for example, the die 104. The heat sink 110 is attached to a bolster plate 114 via connector(s) 116. The bolster plate 114 is envisioned to provide structural support for the device 150. The bolster plate 114 may be attached to a socket 118 via a printed circuit board (PCB) 120. The socket 118 may be attached to the PCB 120 via solder balls (not shown). In an embodiment, it is envisioned that socket 118 may hold a package (e.g., including the substrate, die, lid attach, and/or lid). The device 150 may be utilized as a lidless design for any semiconductor device including an integrated circuit, a processor, an application specific integrated chip (ASIC) and the like.

Figure 2:
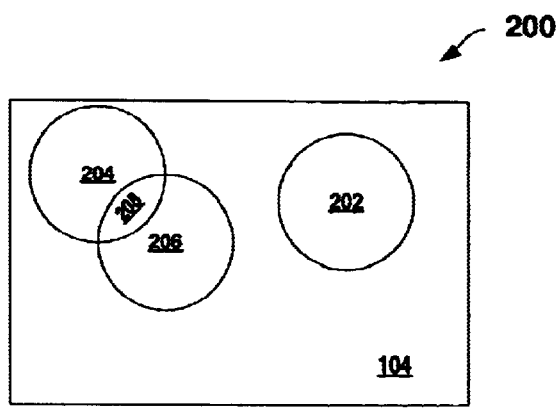
FIG. 2 illustrates an exemplary top view of a device 200 in accordance with an embodiment of the present invention.

FIG. 2 illustrates an exemplary top view of a device 200 in accordance with an embodiment of the present invention. The device 200 includes a semiconductor device/die 104 with regions 202, 204, 206, and 208. Each of the regions (202–208) may have different temperatures at a given time. The region 208 illustrates that in certain embodiments select regions (204 and 206 in this case) may overlap. For example, the region 204 may be hotter than a region 206, but because of their proximity the region 208 may be hotter than the region 206 but cooler than the region 204.

In this example, it is envisioned that the region 204 may be where relatively more signal switching is done in the semiconductor device 104 (for example, the floating point unit of a processor performing floating point operations), whereas the region 206 may be a cache area (where less signal switching is performed for the given floating point operations). For this example, in accordance with an embodiment of the present invention, it is envisioned that to provide thermal uniformity across the device 200, less heat may be removed from the region 206 than the region 204, resulting in a lower thermal differential between these regions. Similarly, the lower thermal differential can result in the region 208 having a temperature closer to both the regions 204 and 206.

Figure 3:
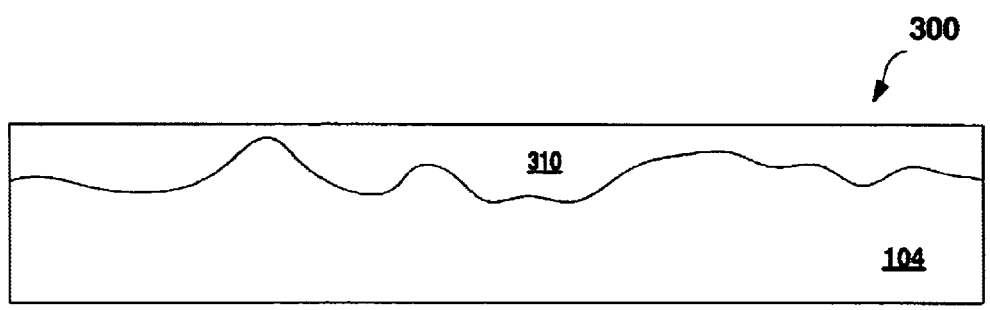
FIG. 3 illustrates an exemplary partial cross-sectional view of a device 300 in accordance with an embodiment of the present invention.

FIG. 3 illustrates an exemplary partial cross-sectional view of a device 300 in accordance with an embodiment of the present invention. The device 300 includes the semiconductor device 104 with a thermal enhancement material 310 disposed thereon. The thermal enhancement material 310 can be any material that changes its thermal conductivity in response to temperature changes. For example, if the temperature of the thermal enhancement material 310 is raised, so will its thermal conductivity (whereas its thermal resistance will be decreased) and vice versa. In one embodiment, the thermal enhancement material 310 is placed as close to the substrate 102 or die 104 (and/or the semiconductor device 104) as possible. This close proximity is envisioned to improve the thermal and mechanical coupling between the semiconductor device 104 and the thermal enhancement material 310.

In an embodiment, the thermal enhancement material 310 may be thin film deposited on the semiconductor device 104 through melting and resolidification. As illustrated in FIG. 3, the thermal enhancement material 310 may conform to the shape of the semiconductor device 104. It is envisioned that the thermal enhancement material 310 may be a thin film, paste, grease, Tyco metallized particles interconnect (MPI), and the like. It is envisioned that according to an embodiment of the present invention, the thermal enhancement material 310 may be located within a thermal path of the semiconductor device 104.

Also, in certain embodiments, the thermal enhancement material 310 may be implemented as a device. In an embodiment, such a device, instead of a film, may be implemented as a layer of a material placed between the chip and the thermal spreader or a heat sink, that has a relatively low Young's Modulus (i.e. soft and high thermal conductivity). Then, as temperature is increased in a given zone, so would the thickness of the layer, thus squeezing the device and reducing thermal contact resistances at both interfaces (chip and heat spreader or heat sink); whereas in a cold zone, the expansion is relatively less and, hence, the thermal contact resistance is higher (i.e., less squeezing). In an embodiment, another possibility would be a thin (about 50 to 100 $\mu$m) "black box" layer that changes its thermal conductivity internally by a mechanism in accordance with its temperature to meet the thermal conductivity/temperature requirements.

Figure 4:
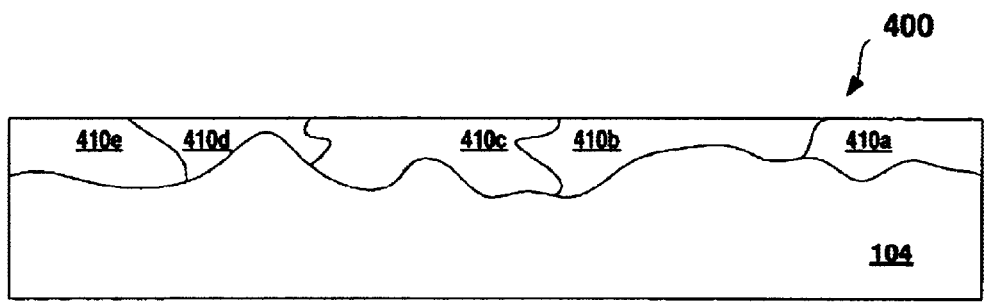
FIG. 4 illustrates an exemplary partial cross-sectional view of a device 400 in accordance with an embodiment of the present invention.

FIG. 4 illustrates an exemplary partial cross-sectional view of a device 400 in accordance with an embodiment of the present invention. The device 400 includes the semiconductor device 104 with thermal enhancement materials 410a–e disposed thereon. It is envisioned that the thermal enhancement materials 410a–e may be implemented utilizing different materials.

In one embodiment, such material may be selected so that higher temperature regions are closer to material with a high thermal conductivity and select cooler regions are more proximate to material with a changing thermal conductivity (as described above with respect to the thermal enhancement material 310). Additionally, each of the thermal enhancement materials 410a–e may be surrounded with other materials with, for example, a lower coefficient of thermal expansion (CTE) to limit physical movements associate with thermal expansion. Also, even though FIG. 4 illustrates the thermal enhancement materials 410a–e laterally adjacent to each other, it is envisioned that the thermal enhancement materials 410a–e may be implemented with vertically adjacent materials (with differing thermal behaviors) to enhance thermal performance of the device 400.

The foregoing description has been directed to specific embodiments. It will be apparent to those with ordinary skill in the art that modifications may be made to the described embodiments, with the attainment of all or some of the advantages. For example, the techniques discussed herein may be applied to any type of heat sensitive device. Therefore, it is the object of the appended claims to cover all such variations and modifications as come within the spirit and scope of the invention.

What is claimed is:

1. An apparatus for enhancing thermal uniformity comprising:
    the semiconductor device including a die, a semiconductor device having a plurality of thermal regions, a first thermal region of the plurality of thermal regions having a different temperature than a second thermal region of the plurality of thermal regions, the first and second thermal regions being on the same die; and
    a thermal enhancement material located substantially adjacent to the first and second thermal regions,
    wherein a thermal conductivity of the thermal enhancement material is adjusted in relation to a temperature effecting the thermal enhancement material.

2. The apparatus of claim 1 wherein the die is a device selected from a group comprising an IC, a processor, and an ASIC.

3. The apparatus of claim 1 wherein the thermal enhancement material is in close proximity to at least one of the first and second thermal regions.

4. The apparatus of claim 1 wherein the thermal enhancement material is located within a thermal path of the semiconductor device.

5. The apparatus of claim 1 wherein the thermal conductivity of the thermal enhancement material increases as the temperature effecting the thermal enhancement material increases.

6. The apparatus of claim 1 wherein the thermal conductivity of the thermal enhancement material decreases as the temperature effecting the thermal enhancement material decreases.

7. The apparatus of claim 1 wherein the thermal enhancement material is in substantial contact with at least one of the first and second thermal regions.

8. The apparatus of claim 1 wherein the first and second thermal regions are in close proximity to each other.

9. The apparatus of claim 1 wherein the first and second thermal regions are in substantial contact.

10. The apparatus of claim 1 wherein the thermal enhancement material includes Tyco MPI.

11. The apparatus of claim 1 wherein the thermal enhancement material conforms to a shape of the die.

12. The apparatus of claim 1 wherein the thermal enhancement material is implemented as a device.

13. The apparatus of claim 1 wherein the thermal enhancement material is implemented utilizing a plurality of materials.

14. The apparatus of claim 13 wherein the plurality of materials have differing thermal conductivities.

15. An apparatus for enhancing thermal uniformity comprising:
    the semiconductor device including a die, a semiconductor device having a plurality of thermal regions, a first thermal region of the plurality of thermal regions having a different temperature than a second thermal region of the plurality of thermal regions, the first and second thermal regions being on the same die; and
    thermal enhancement means located substantially adjacent to the first and second thermal regions,
    wherein a thermal conductivity of the thermal enhancement material is adjusted in relation to a temperature effecting the thermal enhancement material.

16. The apparatus of claim 15 wherein the thermal enhancement material further includes a device.

* * * * *